(12) United States Patent
Ramiah et al.

(10) Patent No.: US 7,803,714 B2
(45) Date of Patent: Sep. 28, 2010

(54) SEMICONDUCTOR THROUGH SILICON VIAS OF VARIABLE SIZE AND METHOD OF FORMATION

(75) Inventors: Chandrasekaram Ramiah, Phoenix, AZ (US); Paul W. Sanders, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 78 days.

(21) Appl. No.: 12/059,123

(22) Filed: Mar. 31, 2008

(65) Prior Publication Data
US 2009/0243074 A1    Oct. 1, 2009

(51) Int. Cl.
  *H01L 21/302* (2006.01)
  *H01L 21/461* (2006.01)
(52) U.S. Cl. .................. 438/712; 438/667; 438/714; 257/E21.218; 257/E21.233
(58) Field of Classification Search ................ 438/424, 438/667, 689, 719, 737, 712, 714, FOR. 110, 438/FOR. 124, FOR. 125; 257/E21.233, 257/E21.218, E21.252
See application file for complete search history.

(56) References Cited

U.S. PATENT DOCUMENTS

| | | | |
|---|---|---|---|
| 5,037,782 A * | 8/1991 | Nakamura et al. | 438/167 |
| 2005/0233581 A1 * | 10/2005 | Soejima et al. | 438/667 |
| 2007/0045780 A1 * | 3/2007 | Akram et al. | 257/621 |
| 2009/0053898 A1 * | 2/2009 | Kommera et al. | 438/701 |

FOREIGN PATENT DOCUMENTS

WO    2007002870 A1    1/2007

OTHER PUBLICATIONS

Carchon, G. et al.; "Technology Platform Integrates High-Performance SiP Modules"; Semiconductor International; Mar. 2008; Magazine Cover and pp. 29-31 ; USA.
Singer, P.; "Through-Silicon Vias Ready for Volume Manufacturing?"; Semiconductor International; Mar. 2008; Magazine Cover and pp. 22-26; USA.
Rowbotham, T. et al.; "Back side exposure of variable size through silicon vias"; Journal of Vacuum Science Technology B vol. 24 No. 5; Sep./Oct. 2006; pp. 2460-2466; American Vacuum Society.

* cited by examiner

*Primary Examiner*—Matthew Smith
*Assistant Examiner*—Quovaunda Jefferson
(74) *Attorney, Agent, or Firm*—Kim-Marie Vo

(57) ABSTRACT

A through-silicon via structure is formed by providing a substrate having a first conductive catch pad and a second conductive catch pad formed thereon. The substrate is secured to a wafer carrier. A first etch of a first type is performed on the substrate underlying each of the first and second conductive catch pads to form a first partial through-substrate via of a first diameter underlying the first conductive catch pad and a second partial through-substrate via underlying the second conductive catch pad of a second diameter that differs from the first diameter. A second etch of a second type that differs from the first type is performed to continue etching the first partial through-substrate to form equal depth first and second through-substrate vias respectively to the first and second conductive catch pads.

14 Claims, 4 Drawing Sheets

SEMICONDUCTOR THROUGH SILICON VIAS OF VARIABLE SIZE AND METHOD OF FORMATION

BACKGROUND

1. Field

This disclosure relates generally to semiconductor processing, and more specifically, to the formation of openings or vias in a semiconductor for making contact to a conductive pad.

2. Related Art

Silicon vias are commonly formed in semiconductors in order to form electrical connections between various layers of conductors in an interconnect structure of an integrated circuit die. The vias which extend from a backside of an integrated circuit die to an active side where circuitry is formed are commonly formed and are referred to as through-silicon vias or simply TSVs. Such TSVs can form backside interconnects for a pair of bonded semiconductor die or bonded semiconductor wafers which are subsequently cut into individual stacked semiconductor die. The TSVs are filled or partially filled with a conductive material such as copper, tungsten, silver or gold. One application is to integrate a Micro Electro-Mechanical Systems (MEMS) sensor die and a semiconductor die wherein a sensing circuit is sealed by the semiconductor die. Through-silicon vias are used to form the electrical connections between the sensor die and the semiconductor die. Another application is to form backside ground connections to the active circuitry in high frequency and high power radio-frequency applications.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

There is herein provided a method of forming through-silicon vias which have variable diameters while having a constant and same depth. The need for vias in a single integrated circuit is particularly relevant in a number of integrated circuits which combine both digital circuitry and analog circuitry. For example, circuitry that implements digital circuitry transmits logic one and logic zero signals and small diameter vias are both desired for size reasons as well as working well to transmit signals that have a clearly defined value. For analog circuitry that processes signals having relative values, the desire for wider diameter vias and conductors exists to minimize conductor resistance, inductance and improve signal accuracy. The method described herein combines the needs of both types of circuitry to enable heterogeneous chip integration. It is important however that the depth of all of the vias be uniform as the TSV etch process proceeds through the silicon. Non-uniform depth vias result in the need to subject faster etching vias to lengthy and undesirable over-etch conditions while the slower etching vias are still completing the etch process, reaching the etch stop or "catch-pad". The condition where faster etching vias and slower etching vias exist on the same wafer leads to extreme demands on the etch stop material and also on the selectivity of the etch process with regard to the comparative etch rates of the RIE process on silicon versus the etch stop material.

Figure 1:
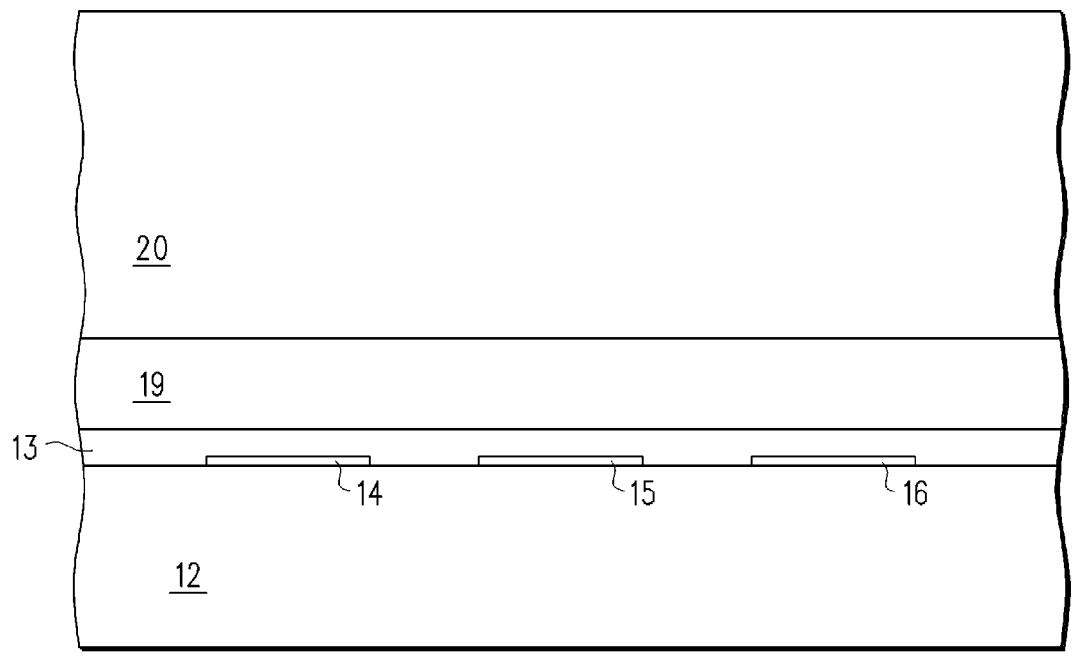
FIGS. 1-6 illustrate in cross-sectional form a semiconductor having variable sized vias in accordance with one form of the present invention.

Illustrated in FIG. 1 is a semiconductor device 10 having a silicon substrate 12. It should be understood that while the present discussion is in the context of silicon, other semiconductor materials may be used rather than silicon. Overlying the silicon substrate 12 and on a top surface thereof are a plurality of catch pads which are formed of conductive material. FIG. 1 illustrates catch pads 14, 15 and 16. The catch pads 14, 15, and 16 are typically thin conductive pads having a thickness that is much smaller in relation to the thickness of the underlying silicon substrate 12. In the illustrated form, each of catch pads 14, 15 and 16 has an equal width. However it should be understood that the width of the catch pads may differ with respect to each other. Any of a variety of conductive materials may be used to implement the catch pads 14, 15 and 16 including various metals. In one form platinum silicide (PtSi) is used. Other conductive materials include, but are not limited to, aluminum, cobalt silicide, tungsten silicide, copper, gold, alloys thereof and other metals. It should be understood that a thin barrier film (not shown) may be formed between the catch pads 14, 15 and 16 and silicon substrate 12 in some embodiments. Such a barrier film functions as a barrier to prevent any of the conductive material, such as aluminum or copper, from diffusing into the silicon substrate 12 and modifying the properties of the silicon substrate 12. The barrier film, in one form, is a conductive nitride such as Titanium nitride and may be deposited and etched as a stack with the catch pad material. In another form the barrier film is Tantalum (Ta). The catch pads 14, 15 and 16 are formed for example by a blanket deposition and selective etch or by the use of a mask and selective deposition or by a damascene process.

Overlying and surrounding the catch pads 14, 15 and 16 is a dielectric layer 13. The dielectric layer 13 is formed by deposition and has a planar top surface. In other forms the top surface of the dielectric layer 13 is not necessarily planar. In one form the dielectric layer 13 is an oxide layer. In another form the dielectric layer 13 is TEOS, tetra-ethyl-ortho-silicate. However, other dielectric materials may be used including low-K dielectric materials. The features described to this point represent a semiconductor wafer in early steps of processing. The wafer is further processed by providing an adhesive layer 19 that overlies the dielectric layer 13. The adhesive layer 19 has a planar top surface. In one form the adhesive layer 19 is a spin-on layer of adhesive material. In another form the adhesive layer 19 is an adhesive tape. Overlying the adhesive layer 19 is a wafer carrier 20 which attaches to semiconductor device 10 as a result of the adhesion properties of the adhesive layer 19. In one form the wafer carrier 20 is formed of glass, sapphire or silicon. It should be understood that the spacing between catch pads 14, 15 and 16 is variable and may be any amount greater than a predetermined minimum spacing defined by process design rules for minimum feature distance separation.

Figure 2:
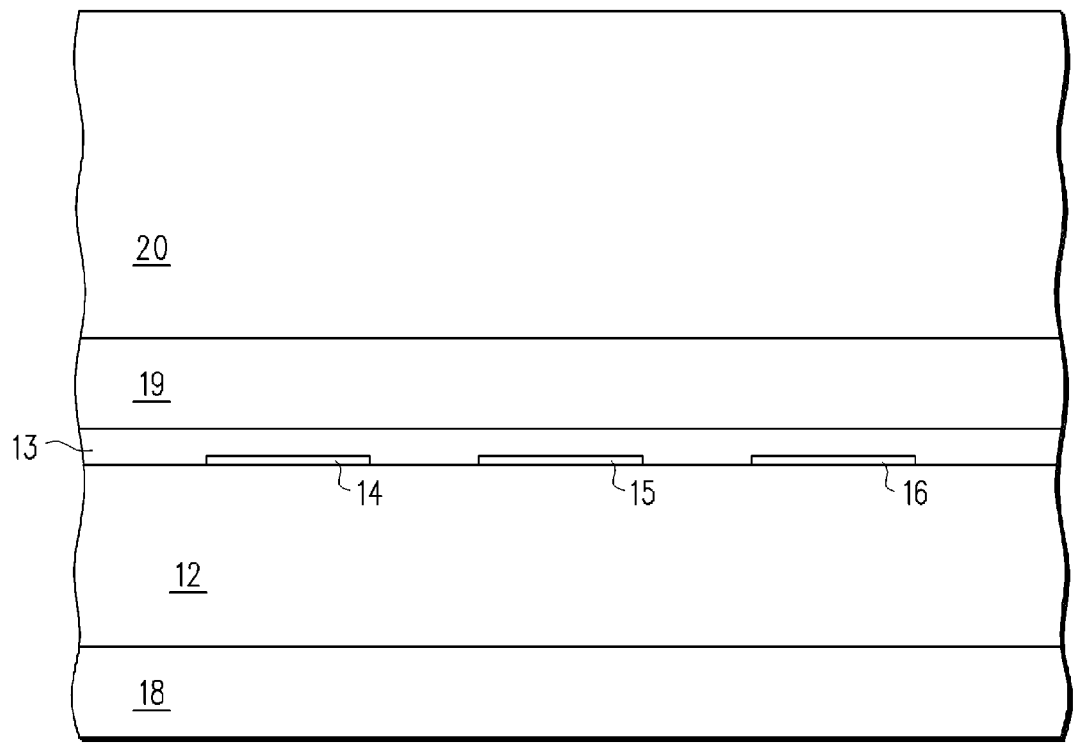

Illustrated in FIG. 2 is further processing of the semiconductor device 10 to form through-substrate or through-silicon vias having variable diameter sizes and same heights. A photoresist layer 18 is blanket deposited on the exposed surface of the silicon substrate 12. The photoresist layer 18 is conventional photoresist material. It should however be noted that the provision of photoresist layer 18, while advantageous, is an optional processing step as will be explained further below.

Figure 3:
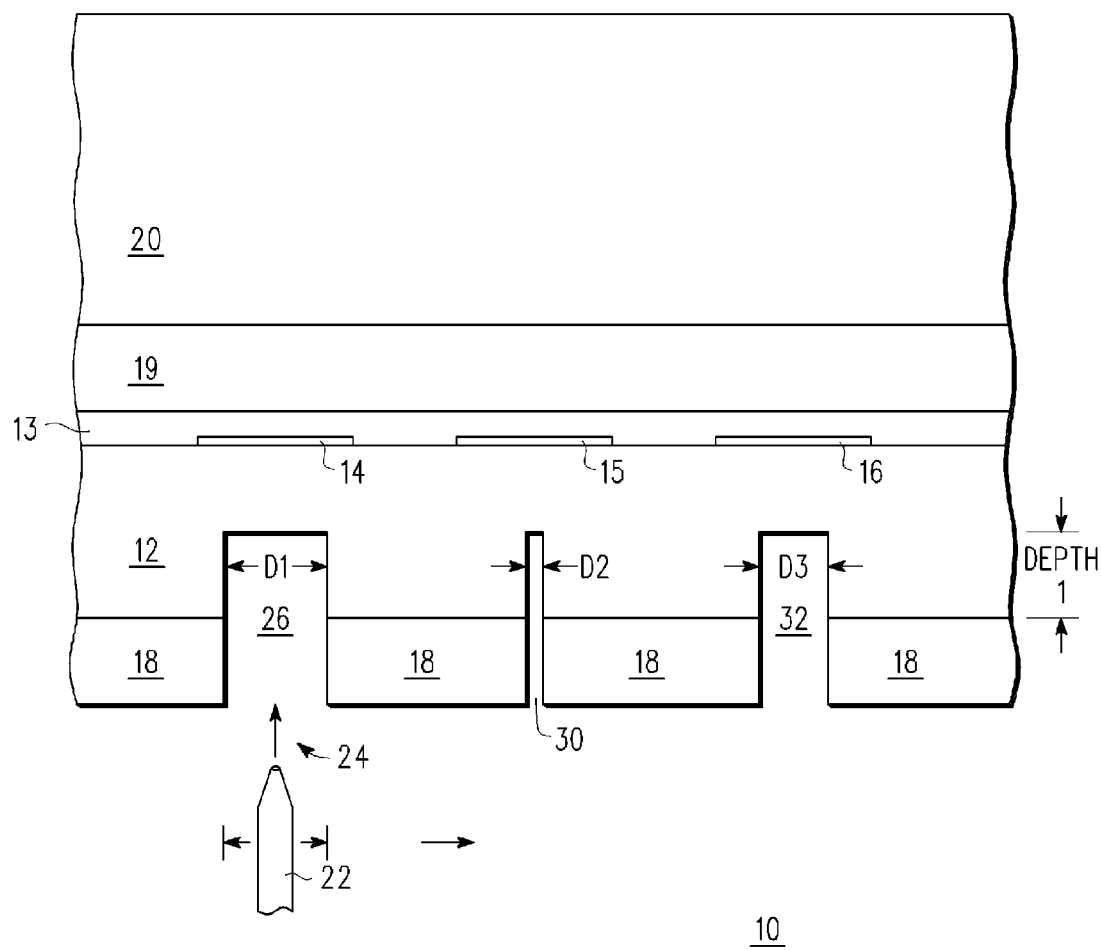

Illustrated in FIG. 3 is further processing of the semiconductor device 10. In this view a laser 22 is provided. The laser 22 is computer programmed with coordinates relative to the semiconductor device 10 to define those portions of the semiconductor device 10 in which a contact is via is to be formed. Laser light 24 from the laser 22 is then aimed only at those portions of the semiconductor device 10 in which material is desired to be removed. For example, in FIG. 3 the laser 22 is illustrated directing laser light 24 at semiconductor device 10 to form a via 26 having a first diameter labeled D1 which is a partial through-substrate or through-silicon via. It should be noted that the distance of diameter D1 is, in a preferred form, less than the total width of the catch pad 14 to ensure that some of catch pad 14 is supported by the silicon substrate prior to the filling or partial filling of via 26 with conductive material. By laterally moving the laser 22 a distance that diameter D1 is desired to equal, the via 26 is formed by cutting through the photoresist layer 18 and a portion of the silicon substrate 12 to a depth illustrated as Depth 1. In another form the laser 22 may be implemented having a pair of shutters to vary the size of the laser beam without requiring lateral movement of laser 22. The distance of Depth 1 is determined by a timed amount of exposure of the laser light 24. It is desired that the time in which laser light 24 is exposed on any one via area is short enough to leave a portion of the silicon substrate 12 between a catch pad and the created via. Otherwise, if the laser light 24 is permitted to remove all of the silicon substrate 12 and hit one of the catch pads, the laser light 24 will quickly continue through the catch pad and destroy it. The laser light 24, if left on too long, will have a power sufficient to continue through a catch pad and into some or all of the overlying materials. Therefore, a limited amount of exposure time is used to create a partial through-silicon via which does not fully penetrate the silicon substrate. As laser 22 is moved laterally, the vias 30 and 32 are formed. The laser 22 is either turned off or not allowed to expose the photoresist layer 18 between vias 26, 30 and 32. By selectively turning the laser 22 on and off or otherwise by selectively exposing only desired portions of the photoresist layer 18, the vias 26, 30 and 32 are formed having three respective diameters of D1, D2 and D3. This results in each of vias 26, 30 and 32 having differing sizes but a same depth of Depth 1 into the silicon substrate 12. The laser ablation provided by laser 22 will cause some splattering of disintegrating silicon material from silicon substrate 12. The photoresist layer 18 functions as a shielding and protective layer to keep this splattered residual material from forming on the bottom surface of the silicon substrate 12.

Figure 4:
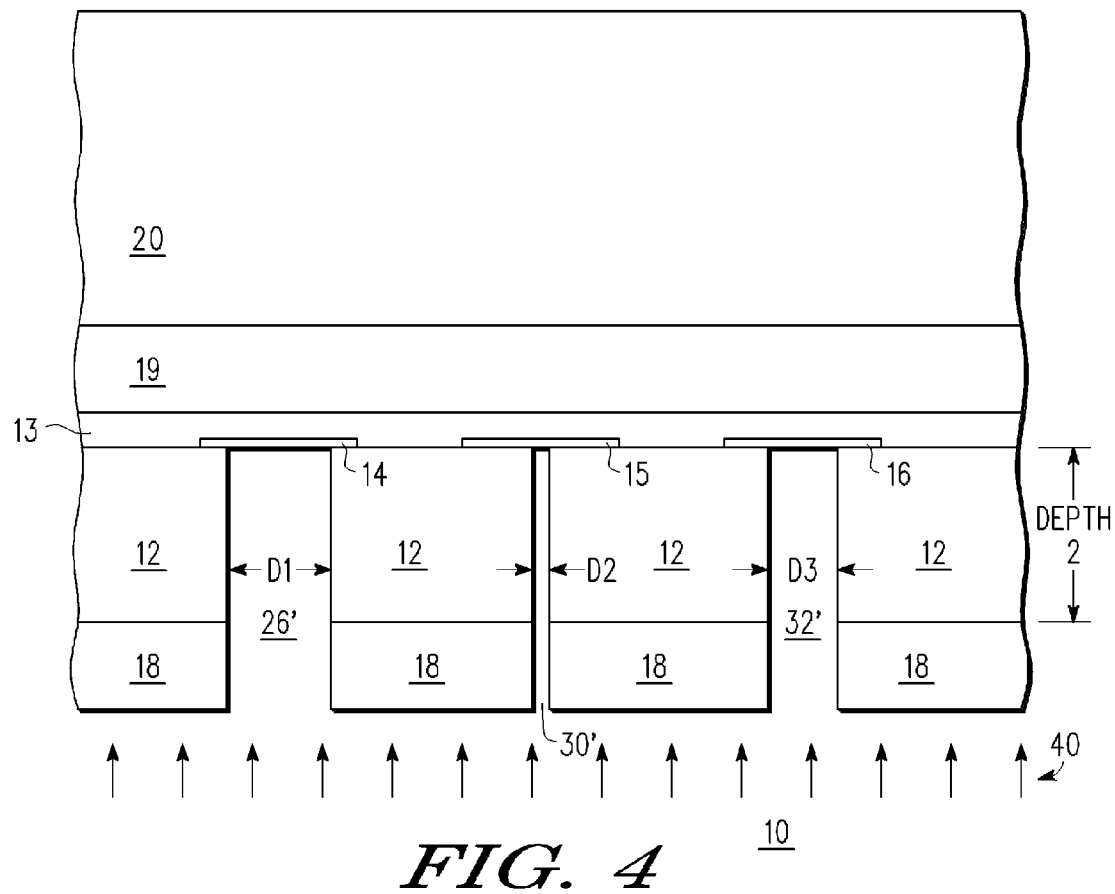

In order to create through-silicon vias out of vias 26, 30 and 32 a second etch process is performed. Illustrated in FIG. 4 is processing of the semiconductor device 10 in which the second etch process is implemented. A reactive ion etch 40 (RIE 40) in the form of a plasma etch is implemented. The reactive ion etch 40 is implemented as a conventional ion etch 40 and is processed for a time that is sufficient for the complete etching of any remainder of the silicon substrate 12 between the previous endpoint of vias 26, 30 and 32 and a respective catch pad. It should be noted that in some applications a post laser etch clean step is implemented prior to the reactive ion etch 40. As a result of the RIE 40, through-silicon vias 26', 30' and 32' are formed in which each of these through-silicon vias has a same depth labeled as Depth 2. Because the second via etch process is a reactive ion etch, the etch needs to be optimized for achieving maximum selectivity to the underlying conductive material used in the catch-pad such that the reactive ion etch does not damage or penetrate the catch pads when the catch pads are exposed. Additionally, it should be noted in FIG. 4 that the reactive ion etching of through-silicon vias 26', 30' and 32' continue the etching begun by laser 22 and continue providing a relatively linear sidewall profile. Several additional advantages exist in connection with the reactive ion etching. When laser ablation occurs from the laser 22, the sidewalls of the vias 26, 30 and 32 tend to be coarse and nonlinear from non-uniform distribution of the laser energy. The subsequent reactive ion etching functions to smooth the nonlinearities along the sidewalls. Additionally, when the photoresist layer 18, which was stated to be optional, is not present, the laser ablating will leave some residual material on the resulting exposed surface of silicon substrate 12. However, the reactive ion etching will function to clean these impurities from the affected surface of silicon substrate 12. For this reason the use of the photoresist layer 18 is optional. Regardless of whether the photoresist layer 18 is used or not, another advantage of the reactive ion etching to complete formation of the through-silicon vias is the relieving of stress within the silicon substrate 12 that was introduced from the laser ablation and during the wafer-thinning process. The relieving of stress in the silicon substrate 12 reduces the interaction of stress fields between adjacent vias. This reduction of stress within the silicon substrate 12 minimizes the chance that stress fields will penetrate into areas proximate to the active circuitry that is later formed above and adjacent to the formed vias. Additionally, the stress-relief increases the strength of the die obtained after subsequent singulation.

Figure 5:
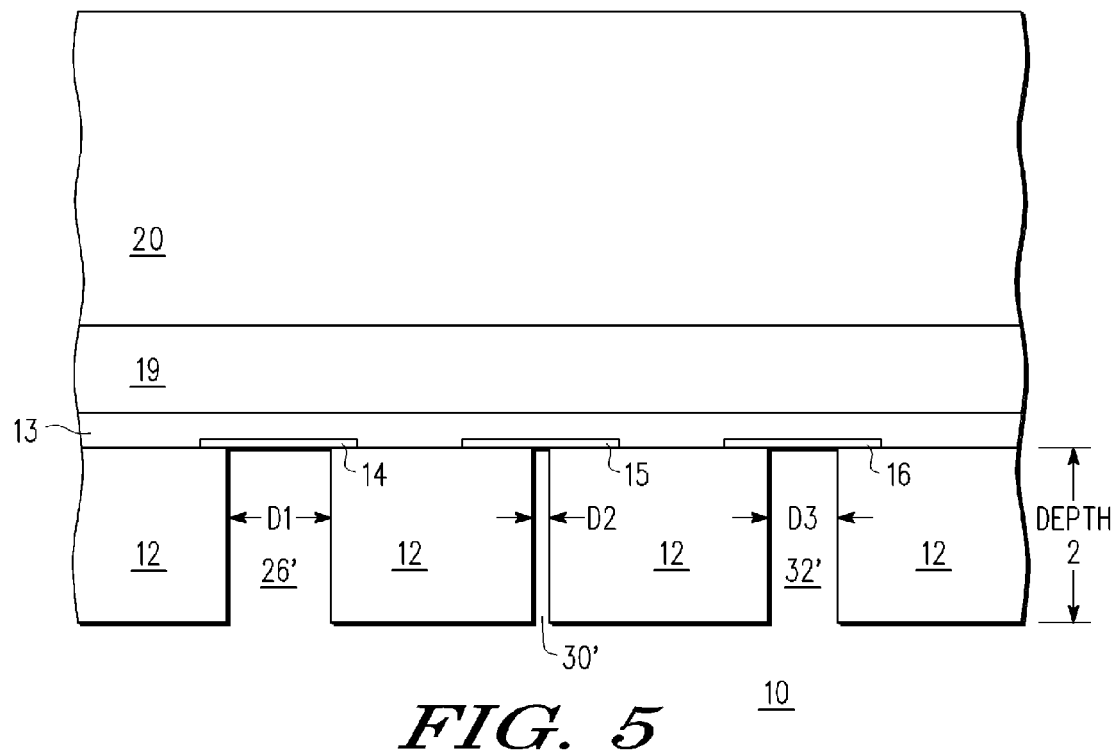

Illustrated in FIG. 5 is further processing of the semiconductor device 10. The reactive ion etching 40 leaves a plurality of through-silicon vias, such as through-silicon vias 26', 30' and 32'. Each of these vias has a diameter that was capable of being sized independently without the use of photoresist or other masking materials. A uniform depth exists for all of the through-silicon vias even though variable size (i.e. diameter) exists for the vias. Therefore, larger sized through-silicon vias may be created in portions of a circuit that are mixed signal (analog circuits and digital circuits) or contain analog circuitry. Smaller sized through-silicon vias may be created in portions of the circuit that are digital logic circuits. It should be understood that the adhesive layer 19 and the overlying wafer carrier 20 remain attached to dielectric layer 13 until completion of all backside processing, excluding die singulation.

Figure 6:
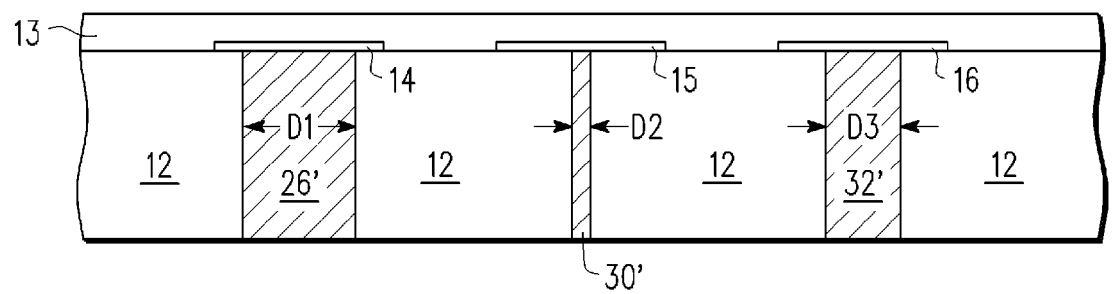

Illustrated in FIG. 6 is semiconductor device 10 after further processing. Upon completion of the backside processing, the adhesive layer 19 and the overlying wafer carrier 20 are removed to leave a semiconductor wafer that is ready for further processing. In one form, a conductive material is formed in all of the openings of each of through-silicon via 26', through-silicon via 30' and through-silicon via 32'. In another form the conductive material may not fill all of the opening of each via. The semiconductor device 10 in FIG. 6 has deep silicon vias of variable diameter that are formed by both a combination of laser ablation and reactive ion etching. The two-etch process described herein results in no physical damage to the catch pads and ensures a good electrical contact with the catch pad. Subsequent to the illustration of FIG. 6, conductive fill material is formed in each of the through-silicon vias 26', 30' and 32'.

By now it should be appreciated that there has been provided a method and via semiconductor structure in which variable sized vias are formed for backside through-silicon vias (TSVs). By using a combination of laser etching and RIE there is provided the ability to obtain backside through-silicon vias that have accurate diameters that may be programmed accurately. The depth of all of the vias is uniform and no damage to catch pads is created. It should be noted that if the thin catch pads were exposed to the laser 22, the resulting energy would quickly vaporize the catch pads and destroy the circuit. Because the diameter of a backside through-silicon via is determined by laser light, the dimensions of the range of diameters that may be implemented are varied and may be very small to significantly miniaturize a semiconductor device.

In one form there is herein provided a method of forming variable size vias by providing a substrate having a first conductive catch pad and a second conductive catch pad formed thereon. The substrate is secured to a wafer carrier. A first etch of a first type is performed on the substrate underlying each of the first and second conductive catch pads to form a first partial through-substrate via of a first diameter underlying the first conductive catch pad and a second partial through-substrate via underlying the second conductive catch pad of a second diameter. The second diameter differs from the first diameter. A second etch of a second type that differs from the first type is performed on the substrate to continue etching the first partial through-substrate to form a first through-substrate via to the first conductive catch pad and to continue etching the second partial through-substrate to form a second through-substrate via to the second conductive catch pad. Each of the first partial through-substrate via and the second partial through-substrate via have a same depth.

Some of the above embodiments, as applicable, may be implemented using a variety of different structures and materials. For example, each of the catch pads may be implemented using different structures than those specifically illustrated. In one form each catch pad may be implemented by at least two distinct metal layers, each of which is segmented and divided by intervening and interdigitated dielectric material. The formation of a contact structure uses a conductive via liner that contacts both the first layer of metal and the second layer of metal through holes or slots in the first layer of metal. Thus the alignment of slots or gaps in the first layer of metal exposes the second layer of metal. In another form the at least two metal layers may be connected directly together. Yet other conductive structures may be used in lieu of the catch pads as illustrated.

Although the invention is described herein with reference to specific embodiments, various modifications and changes can be made without departing from the scope of the present invention as set forth in the claims below. For example, all of the through-silicon vias in a particular portion of a semiconductor die may be made of a same size (i.e. same diameter and same depth) using the two different etch-type process. The method described herein may form through silicon vias that are implemented in a variety of types of semiconductors, including all types of high-frequency and high-power semiconductor devices.

There is herein provided a method of forming a semiconductor by providing a substrate having a first conductive catch pad and a second conductive catch pad formed thereon. The substrate is secured to an overlying wafer carrier. A first etch of a first type is performed on the substrate underlying each of the first conductive catch pad and the second conductive catch pad to form a first partial through-substrate via of a first via diameter underlying the first conductive catch pad and a second partial through-substrate via underlying the second conductive catch pad of a second via diameter that differs from the first via diameter. A second etch of a second type that differs from the first type is performed on the substrate to continue etching the first partial through-substrate via to form a first through-substrate via to the first conductive catch pad and to continue etching the second partial through-substrate via to form a second through-substrate via to the second conductive catch pad. Each of the first through-substrate via and the second through-substrate via has a same depth. In one form the first etch is performed as a laser etch, and the second etch is performed as a reactive ion etch (RIE). In another form the laser is laterally moved when forming at least one of the first diameter or the second diameter. In another form the substrate is a silicon substrate. In yet another form a third through-substrate via is formed in the substrate to a third conductive catch pad by using both the first etch and the second etch. The third through-substrate via has a third diameter that differs from the first diameter and the second diameter. In another form a layer of photoresist material is formed on the substrate prior to performing the first etch. Selected portions of both the photoresist material and the substrate are etched during the first etch. The photoresist material protects the substrate during the first etch. In another form the first diameter is implemented to be less than a width of the first conductive catch pad. The second diameter is implemented to be less than a width of the second conductive catch pad.

In another form there is provided a semiconductor having a substrate having a first conductive catch pad and a second conductive catch pad formed thereon. A wafer carrier overlies and is attached to the substrate by an adhesive. The substrate further has a first through-substrate via of a first diameter underlying the first conductive catch pad filled with a conductive material in contact with the first conductive catch pad. A second through-substrate via underlies the second conductive catch pad of a second diameter that differs from the first diameter. The second conductive catch pad is filled with the conductive material in contact with the second conductive catch pad. The first through-substrate via and the second through-substrate via have a same depth. In one form a layer of photoresist material is on the substrate. The photoresist material protects the substrate during formation of the first through-substrate via and the second through-substrate via. In another form the substrate is a silicon substrate. In another form there is provided a third through-substrate via in the substrate that is in contact with a third conductive catch pad. The third through-substrate via has a third diameter that differs from the first diameter and the second diameter and has the same depth as the first through-substrate via and the second through-substrate via. In yet another form each of the first through-substrate via, the second through-substrate via and the third through-substrate via is filled with conductive material of the same depth.

In another form there is provided a method that provides a silicon substrate having a first conductive pad and a second conductive pad formed thereon at an upper surface. A dielectric layer overlies and electrically separates the first conductive pad and the second conductive pad. The silicon substrate is secured to an overlying wafer carrier. A laser etch on a lower surface of the silicon substrate underlying each of the first conductive pad and the second conductive pad is performed to form a first partial through-silicon substrate via of a first diameter underlying the first conductive pad and a second partial through-silicon substrate via underlying the second conductive pad of a second diameter that differs from the first diameter. A reactive ion etch on the silicon substrate is performed to continue etching the first partial through-silicon substrate via to form a first through-silicon substrate via to the first conductive pad and to continue etching the second partial through-silicon substrate via to form a second through-silicon substrate via to the second conductive pad. Each of the first through-silicon substrate via and the second through-silicon substrate via has a same depth.

In another form a photoresist layer is formed on the lower surface of the silicon substrate prior to performing the laser etch and the reactive ion etch. The photoresist material protects the silicon substrate. In another form the laser is laterally moved when forming at least one of the first diameter or the second diameter. In yet another form there is provided the formation of a third through-silicon substrate via in the silicon substrate that is in contact with a third conductive pad at the upper surface of the silicon substrate. The third through-silicon substrate via has a third diameter that differs from the first diameter and the second diameter and has the same depth as the first through-silicon substrate via and the second through-silicon substrate via. In another form the first through-silicon substrate via, the second through-silicon substrate via and the third through-silicon substrate via are filled with conductive material of the same depth. In yet another form the first diameter is implemented to be less than a width of the first conductive pad. The second diameter is implemented to be less than a width of the second conductive pad. The third diameter is implemented to be less than a width of the third conductive pad. In one form securing the silicon substrate to an overlying wafer carrier is implemented by applying an adhesive layer onto the dielectric layer and attaching the wafer carrier to the adhesive layer. In yet another form the wafer carrier is removed subsequent to formation of the first through-silicon substrate via and the second through-silicon substrate via to permit further processing.

Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements. Accordingly, the specification and figures are to be regarded in an illustrative rather than a restrictive sense, and all such modifications are intended to be included within the scope of the present invention.

What is claimed is:

1. A method, comprising:
   providing a substrate having a first conductive catch pad and a second conductive catch pad formed thereon;
   securing the substrate to an overlying wafer carrier;
   performing a laser etch on the substrate underlying each of the first conductive catch pad and the second conductive catch pad to form a first partial through-substrate via of a first via diameter underlying the first conductive catch pad and a second partial through-substrate via underlying the second conductive catch pad of a second via diameter that differs from the first via diameter by selectively exposing the substrate to a laser to form the second via diameter different from the first via diameter;
   performing a reactive ion etch (RIE) on the substrate to continue etching the first partial through-substrate via to form a first through-substrate via to the first conductive catch pad and to continue etching the second partial through-substrate via to form a second through-substrate via to the second conductive catch pad, each of the first through-substrate via and the second through-substrate via having a same depth; and
   forming a smaller of the first via diameter and the second via diameter in a digital logic circuit and forming a larger of the first via diameter and the second via diameter in analog circuitry.

2. The method of claim 1 further comprising:
   performing a post laser etch clean step; and
   performing the reactive ion etch (RIE) as a plasma etch.

3. The method of claim 1 further comprising:
   providing the substrate as a silicon substrate.

4. The method of claim 1 further comprising:
   forming a third through-substrate via in the substrate to a third conductive catch pad by using both the laser etch and the reactive ion etch, the third through-substrate via having a third via diameter that differs from the first via diameter and the second via diameter.

5. The method of claim 1 further comprising:
   providing a layer of photoresist material on the substrate prior to performing the laser etch and etching selected portions of both the photoresist material and the substrate during the laser etch, the photoresist material protecting the substrate during the laser etch.

6. The method of claim 1 further comprising:
   implementing the first via diameter to be less than a width of the first conductive catch pad; and
   implementing the second via diameter to be less than a width of the second conductive catch pad.

7. A method comprising:
   providing a substrate having a first conductive catch pad and a second conductive catch pad formed thereon;
   securing the substrate to an overlying wafer carrier;
   performing a laser etch on the substrate underlying each of the first conductive catch pad and the second conductive catch pad to form a first partial through-substrate via of a first via diameter underlying the first conductive catch pad and a second partial through-substrate via underlying the second conductive catch pad of a second via diameter that differs from the first via diameter wherein a laser is laterally moved to determine a value of at least one of the first via diameter and the second via diameter; and
   performing a reactive ion etch (RIE) on the substrate to continue etching the first partial through-substrate via to form a first through-substrate via to the first conductive catch pad and to continue etching the second partial through-substrate via to form a second through-substrate via to the second conductive catch pad, each of the first through-substrate via and the second through-substrate via having a same depth.

8. A method comprising:
   providing a silicon substrate having a first conductive pad and a second conductive pad formed thereon at an upper surface;
   forming a dielectric layer overlying and electrically separating the first conductive pad and the second conductive pad;
   securing the silicon substrate to an overlying wafer carrier;
   performing a laser etch on a lower surface of the silicon substrate underlying each of the first conductive pad and the second conductive pad to form a first partial through-silicon substrate via having a first via diameter and underlying the first conductive pad and a second partial through-silicon substrate via underlying the second conductive pad having a second via diameter that differs from the first via diameter, said performing implemented by laterally moving a laser when forming at least one of the first via diameter or the second via diameter to determine a via diameter value; and performing a reactive ion etch on the silicon substrate to continue etching the first partial through-silicon substrate via to form a first through-silicon substrate via to the first conductive pad and to continue etching the second partial through-silicon substrate via to form a second through-silicon substrate via to the second conductive pad, each of the first through-silicon substrate via and the second through-silicon substrate via having a same depth.

9. The method of claim 8 further comprising:
forming a photoresist layer on the lower surface of the silicon substrate prior to performing the laser etch and the reactive ion etch, the photoresist material protecting the silicon substrate.

10. The method of claim 8 further comprising:
forming a third through-silicon substrate via in the silicon substrate that is in contact with a third conductive pad at the upper surface of the silicon substrate, the third through-silicon substrate via having a third via diameter that differs from the first via diameter and the second via diameter and having the same depth as the first through-silicon substrate via and the second through-silicon substrate via.

11. The method of claim 10 further comprising:
filling at least a portion of each of the first through-silicon substrate via, the second through-silicon substrate via and the third through-silicon substrate via with conductive material of the same depth.

12. The method of claim 10 further comprising:
implementing the first via diameter to be less than a width of the first conductive pad;
implementing the second via diameter to be less than a width of the second conductive pad; and
implementing the third via diameter to be less than a width of the third conductive pad.

13. The method of claim 8 wherein securing the silicon substrate to an overlying wafer carrier further comprises:
applying an adhesive layer onto the dielectric layer; and
attaching the wafer carrier to the adhesive layer.

14. The method of claim 8 further comprising:
removing the wafer carrier subsequent to formation of the first through-silicon substrate via and the second through-silicon substrate via to permit further processing.

* * * * *